United States Patent [19]
Tsukada

[11] Patent Number: 6,101,140
[45] Date of Patent: Aug. 8, 2000

[54] SENSE AMPLIFIER DRIVER CIRCUIT FOR SUPPLYING A REDUCED DRIVING VOLTAGE TO SENSE AMPLIFIER

[75] Inventor: Shyuichi Tsukada, Tokyo, Japan

[73] Assignee: NEC Corporation, Tokyo, Japan

[21] Appl. No.: 09/372,976

[22] Filed: Aug. 12, 1999

[30] Foreign Application Priority Data

Aug. 12, 1998 [JP] Japan .................................. 10-228183

[51] Int. Cl.[7] ..................................................... G11C 7/00
[52] U.S. Cl. ........................................... 365/205; 365/207
[58] Field of Search .................................... 365/205, 207, 365/189.07, 189.09, 230.06, 226

[56] References Cited

U.S. PATENT DOCUMENTS 5,982,690 11/1999 Austin ...................................... 365/205

*Primary Examiner*—David Nelms
*Assistant Examiner*—David Lam
*Attorney, Agent, or Firm*—Young & Thompson

[57] ABSTRACT

The present invention provides a sense amplifier driver circuitry connected to a power voltage supply line supplying a power voltage and also connected to a driving voltage supply line supplying a driving voltage. The driver circuitry comprises: a first circuit having a first input terminal receiving at least a first reference voltage and a second input terminal connected to the driving voltage supply line for feeding the driving voltage back to the second input terminal for comparing the driving voltage with the reference voltage, and the first circuit having an output terminal for outputting an output voltage which accords to a difference in potential between the driving voltage and the reference voltage; a switching device connected between the power voltage supply line and driving voltage supply line, the switching device having a control terminal connected to the output terminal of the first circuit for receiving the output voltage so that the switching device performs ON-OFF switching operations in accordance with the output voltage; and a high speed driving device connected to the control terminal of the switching device for turning the switching device ON at a higher speed than when the switching device turns ON in accordance with the output voltage from the first circuit.

12 Claims, 10 Drawing Sheets

SENSE AMPLIFIER DRIVER CIRCUIT FOR SUPPLYING A REDUCED DRIVING VOLTAGE TO SENSE AMPLIFIER

BACKGROUND OF THE INVENTION

The present invention relates to a sense amplifier driver circuit, and more particularly to a sense amplifier driver circuit for supplying a reduced power voltage to a sense amplifier for a dynamic semiconductor memory device.

In recent years, increases in capacity and high density of the dynamic semiconductor memory device has been promoted whilst scaling down devices used in the dynamic semiconductor memory device is remarkable. Scaling down the devices cause reduction in thickness of a capacitive film or dielectric film of a memory capacitor and a gate insulation film of a field effect transistor. The reduction in thickness of the capacitive film and the gate insulation film causes drop of withstand voltage of the memory capacitor and the field effect transistor. The drop in the withstanding voltage of the devices in the dynamic semiconductor memory device causes a reduction in reliability of the dynamic semiconductor memory device, In order to have avoided drop of the reliability of the device and also to have curtailed power consumption of the memory device, it had been proposed to supply a lower voltage than the power voltage Vcc to a memory cell array in he memory device.

FIG. 1 is a block diagram illustrative of a circuit configuration of the general dynamic semiconductor memory device, where an external power voltage is reduced for subsequent supply to memory cell arrays.

As shown in FIG. 1, one or more internal reduced voltage generation circuit 61 is provided on a chip for generating an internal reduced power voltage Vmt1. A plurality of memory cell arrays 62-1, 62-2, 62-3, - - - 62-N are also provided on the chip. An output side of the internal reduced voltage generation circuit 61 is connected to the memory cell arrays 62-1, 62-2, 62-3, - - - 62-N. FIG. 2 is a circuit diagram illustrative of a differential amplifier circuit in the internal reduced voltage generation circuit shown in FIG. 1. The internal reduced voltage generation circuit 61 comprises a differential amplifier circuit 63 and a p-channel MOS field effect transistor Q8. One input of the differential amplifier circuit 63 receives a reference voltage Vref as a reference to an internal reduction voltage level. Another input of the differential amplifier circuit 63 receives the internal reduced power voltage Vmt1 as the output from the internal reduced voltage generation circuit 61. An output terminal of the differential amplifier circuit 63 is connected to a gate of the p-channel MOS field effect transistor Q8. A source of the p-channel MOS field effect transistor Q8 is connected to a power voltage line which supplies a power voltage Vcc. A drain of the p-channel MOS field effect transistor Q8 is connected to the memory cell arrays 62-1, 62-2, 62-3, - - - 62-N, so that the internal reduced power voltage Vint1 is supplied from the drain of the p-channel MOS field effect transistor Q8 to the memory cell arrays 62-1, 62-2, 62-3, - - - 62-N. Namely, the internal reduced voltage generation circuit 61 outputs the internal reduced power voltage Vint1. Parasitic capacitances R11, R12, R13, - - - R1N exit on the interconnection between the internal reduced voltage generation circuit 61 and the memory cell arrays 62-1, 62-2, 62-3, - - - 62-N. Those parasitic capacitances R11, R12, R13, - - - R1N reduce the voltage levels to be supplied to the memory cell arrays 62-1, 62-2, 62-3, - - - 62-N. The actual voltages supplied to the memory cell arrays 62-1, 62-2, 62-3, - - - 62-N are thus lower than the internal reduced power voltage Vint1. For example, the memory cell arrays 62-1, 62-2, 62-3, - - - 62-N are supplied with voltages Vint11, Vint12, Vint13, - - - Vint1N.

The memory cell arrays 62-1, 62-2, 62-3, - - - 62-N have the same circuit configuration, for which reason only the circuit configuration of the memory cell array 62-1 will be described whilst the circuit configuration of the other memory cell arrays 62-2, 62-3, - - - 62-N will be omitted. The memory cell array 62-1 has a plurality of alignments of memory cells MC, sense amplifiers SA for every alignments of the memory cells MC, a plurality of word lines WL and a plural pairs of memory cell digit lines DT and DN or bit lines. Each of the memory cell MC is positioned at one of cross points of the word lines WL and the memory cell digit lines DT. The memory cell MC is connected to both one word line WL and one memory cell digit line DT, a crossing point of which is a position where the memory cell MC is provided. For example, a memory cell MC0 is connected to both a word line WL0 and a memory cell digit line DT0. Although illustration is omitted, memory cells are provided which are connected to the memory cell digit lines DN.

Further, sense amplifier digit lines BT and BN are also provided. The sense amplifier digit lines BT and BN are connected in series through n-channel MOS field effect transistors Q7 to the memory cell digit lines DT and DN. Gates of the n-channel MOS field effect transistors Q7 are connected to a gate control line TG. For example, the sense amplifier digit line DT0 is connected through the n-channel MOS field effect transistor Q7 to the memory cell digit line DT0. The sense amplifier digit line BN0 is connected through the n-channel MOS field effect transistor Q7 to the memory cell digit line DN0.

Each of the sense amplifiers SA is connected to a corresponding pair of the sense amplifier digit lines BT and BN. For example, the sense amplifier SA0 is connected to the sense amplifier digit lines BT0 and BN0.

All of the sense amplifiers SA are connected to power supply lines SAP and SAN. The power supply line SAN is connected in series to a ground line through an n-channel MOS field effect transistor 64 having a gate, to which a control signal (SAN. This ground line supplies a ground potential as a reference voltage GND. The other power supply line SAP is connected through a p-channel MOS field effect transistor Q9 and the interconnection to the internal reduced voltage generation circuit 61. The p-channel MOS field effect transistor Q9 has a gate receiving a control signal ΦSAP. Namely, the voltage Vint11, which is lower than the internal reduced power voltage Vmt1, is supplied through the p-channel MOS field effect transistor Q9 to the memory cell array 62-1. Each of the sense amplifiers SA is operated to sense a potential difference or a voltage difference between the paired sense amplifier digit lines BT and BN connected with the sense amplifier SA so that the sense amplifier SA is then operated to amplify the sensed potential difference.

The following descriptions will focus on operations of the dynamic semiconductor memory device shown in FIG. 1. FIG. 3 is a waveform explaining operations of the dynamic semiconductor memory device shown in FIG. 1.

When one of the word lines WL, for example, the word line WL0 is selected, a potential of the selected word line WL0 is increased up to a predetermined level, whereby the transistor of the memory cell MC0 turns ON to allow stored information in the memory cell MC0 to be transmitted onto the memory cell digit line DT0. If high level has been stored in the memory cell MC0, as the potential increase of the word line WL0 causes a slight increase in potential of the memory cell digit line DT0. At this time, also the potential of the control line TG connected to the gate of the n-channel MOS field effect transistor Q7 is fixed in high level, and thus the n-channel MOS field effect transistor Q7 between the sense amplifier digit line BT0 and the memory cell digit line DT0 remains in ON state. Therefore, the potential is the same between the memory cell digit line DT0 and the sense amplifier digit line BT0. Accordingly, a potential increase of the memory cell digit line DT0 causes a corresponding potential increase of the sense amplifier digit line BT0.

Thereafter, the potential level of the control line TG connected to the gates of the n-channel MOS field effect transistors Q7 is reduced down to the low level. Further, the control signal ΦSAP becomes low level, whilst the control signal ΦSAN becomes high level, whereby the sense amplifier SA is activated to commence its sense operation. Namely, the sense amplifier SA0 is operated to sense and amplify a slight difference in potential between the paired sense amplifier digit lines BT0 and BN0 connected to the sense amplifier SA0. As a result of the amplification by the sense amplifier SA0, the potential of the sense amplifier digit line BT0 becomes close to the internal reduced voltage level Vref1, whilst the potential of the sense amplifier digit line BN0 becomes close to the reference voltage GND. Once the potentials of the sense amplifier digit lines BT0 and BN0 reach the internal reduced voltage level Vref1 and the reference voltage GND respectively, the sense amplification operation is completed. At the same time when the sense amplification operation is completed, the potential of the control line TG is risen up to the predetermined level to turn the n-channel MOS field effect transistor Q7 ON so that the paired memory cell digit lines DT0 and DN0 are made connected to the paired sense amplifier digit lines BT0 and BN0 respectively, whereby re-store operation is carried out to re-write data into a capacitor of the memory cell MC0. As a result of the re-writing operation, the potential of the memory cell digit line DT0 is made close to the internal reduced voltage Vref1, whilst the potential of the memory cell digit line DN0 reaches the reference voltage GND, whereby charges are accumulated in the capacitor of the memory cell MC0.

The above described conventional dynamic semiconductor memory device is, however, engaged with the following problems.

As being appeared from FIG. 3, when relatively large currents flow through the power supply line SAP such as the sense amplification operation and the re-store operation, a large drop of the internal reduced power voltage level appears. This voltage level drop of the internal reduced power voltage level causes delay in operational speeds in the sense amplification operation and he re-store operation. Even if in order to solve this problem, the width of the interconnection which interconnecting the internal reduced power voltage generation circuit Vint and the individual memory cell arrays are widen to reduce the resistance of the interconnection, another problem with layout is raised due to an enlargement of area of the interconnection.

The transistor such as the p-channel MOS field effect transistor Q9 connected through the interconnection to the internal reduced power voltage generation circuit Vint is required to satisfy the conduction that a difference in potential between source and drain is small, for which reason in order to flow a large current, it is required to enlarge the size of the transistor.

It is preferable to reduce the internal reduced voltage level Vref1 as low as possible for improvement in reliability of the device and for reduction in power consumption. However, the reduction in internal reduced voltage level Vref1 raises a problem in delay of the sense amplifying operations of the sense amplifier. In order to have solved this problem with the delay in sense amplifying operations of the sense amplifier, an over-drive system for a driving technique of the sense amplifier was proposed. Those conventional over-drive techniques are disclosed, for example, in Japanese laid-open patent publications Nos. 5-135579, 9-63271 and 9-120675.

FIG. 4 is a block diagram illustrative of a circuit configuration of the dynamic semiconductor memory device operable in over-drive system. The circuit configuration of the over-drive dynamic semiconductor memory device shown in FIG. 4 differs from the general dynamic semiconductor memory device shown in FIG. 1 in the light of further provision of a secondary internal reduced voltage generation circuit 91 which generates a second internal reduced voltage Vint2. One input of the secondary internal reduced voltage generation circuit 91 is applied with a second voltage Vref2 which is higher in potential than the first voltage Vref2 applied to the first internal reduced voltage generation circuit 61. An output of the secondary internal reduced voltage generation circuit 91 is connected through a second interconnection to the memory cell arrays. In each of the memory cell arrays, a p-channel MOS field effect transistor Q10 is further provided which is connected in series between the second interconnection and the power supply line SAP of the memory cell array. Namely, the secondary internal reduced voltage generation circuit 91 is connected through the second interconnection to the power supply line SAP of the memory cell array. The second interconnection also has a parasitic capacitance as the first interconnection. A gate of the p-channel MOS field effect transistor Q10 is applied with a control signal ΦSAP2 which is different from a control signal ΦSAP1 applied to the gate of the n-channel MOS field effect transistor Q9.

As a modification to the conventional over-drive dynamic semiconductor memory device shown in FIG. 4, it is possible that a power voltage line which supplies a power voltage Vcc is connected directly to the p-channel MOS field effect transistor Q10 without, however, providing the above secondary internal reduced voltage generation circuit 91.

With reference again to FIG. 4, the conventional circuit configuration of the over-drive dynamic semiconductor memory device will be described in more detail.

First and second internal reduced voltage generation circuits 61 and 91 are provided on a chip for generating first and second internal reduced power voltages Vint1 and Vint2 respectively. A plurality of memory cell arrays 62-1, 62-2, 62-3, - - - 62-N are also provided on the chip. An output side of the first internal reduced voltage generation circuit 61 is connected to the memory cell arrays 62-1, 62-2, 62-3, - - - 62-N. An output side of the second internal reduced voltage generation circuit 91 is connected to the memory cell arrays 62-1, 62-2, 62-3, - - - 62-N. The first internal reduced voltage generation circuit 61 comprises a differential amplifier circuit 63 and a p-channel MOS field effect transistor Q8. The second internal reduced voltage generation circuit 91 also comprises a differential amplifier circuit and a p-channel MOS field effect transistor.

One input of the differential amplifier circuit 63 of the first internal reduced voltage generation circuit 61 receives a first reference voltage Vref1 as a first reference to a first internal reduction voltage level. Another input of the differential amplifier circuit 63 of the first internal reduced voltage generation circuit 61 receives the first internal reduced power voltage Vint1 as the first output from the first internal reduced voltage generation circuit 61. An output terminal of the differential amplifier circuit 63 of the first internal reduced voltage generation circuit 61 is connected to a gate of the p-channel MOS field effect transistor Q8 of the first internal reduced voltage generation circuit 61. A source of the p-channel MOS field effect transistor Q8 of the first internal reduced voltage generation circuit 61 is connected to a power voltage line which supplies a power voltage Vcc. A drain of the p-channel MOS field effect transistor Q8 of the first internal reduced voltage generation circuit 61 is connected to the memory cell arrays 62-1, 62-2, 62-3, - - - 62-N, so that the first internal reduced power voltage Vint1 is supplied from the drain of the p-channel MOS field effect transistor Q8 to the memory cell arrays 62-1, 62-2, 62-3, - - - 62-N. Namely, the first internal reduced voltage generation circuit 61 outputs the first internal reduced power voltage Vint1.

One input of the differential amplifier circuit of the second internal reduced voltage generation circuit 91 receives a second reference voltage Vref2 as a second reference to a second internal reduction voltage level. Another input of the differential amplifier circuit of the second internal reduced voltage generation circuit 91 receives the second internal reduced power voltage Vint2 as the second output from the second internal reduced voltage generation circuit 91. An output terminal of the differential amplifier circuit of the second internal reduced voltage generation circuit 91 is connected to a gate of the p-channel MOS field effect transistor of the second internal reduced voltage generation circuit 91. A source of the p-channel MOS field effect transistor of the second internal reduced voltage generation circuit 91 is connected to the power voltage line which supplies the power voltage Vcc. A drain of the p-channel MOS field effect transistor of the second internal reduced voltage generation circuit 91 is connected to the memory cell arrays 62-1, 62-2, 62-3, - - - 62-N, so that the second internal reduced power voltage Vint2 is supplied from the drain of the p-channel MOS field effect transistor to the memory cell arrays 62-1, 62-2, 62-3, - - - 62-N. Namely, the second internal reduced voltage generation circuit 91 outputs the second internal reduced power voltage Vint2.

Parasitic capacitances R11, R12, R13, - - - R1N exit on the first interconnection between the first internal reduced voltage generation circuit 61 and the memory cell arrays 62-1, 62-2, 62-3, - - - 62-N. Those parasitic capacitances R11, R12, R13, - - - R1N reduce the voltage levels to be supplied to the memory cell arrays 62-1, 62-2, 62-3, - - - 62-N. The actual voltages supplied to the memory cell arrays 62-1, 62-2, 62-3, - - - 62-N are thus lower than the first internal reduced power voltage Vint1. For example, the memory cell arrays 62-1, 62-2, 62-3, - - - 62-N are supplied with voltages Vint11, Vint12, Vint13, - - - Vint1N which have been transmitted through the second interconnection from the first internal reduced voltage generation circuit 61.

Parasitic capacitances R21, R22, R23, - - - R2N exit on the second interconnection between the second internal reduced voltage generation circuit 91 and the memory cell arrays 62-1, 62-2, 62-3, - - - 62-N. Those parasitic capacitances R21, R22, R23, - - - R2N reduce the voltage levels to be supplied to the memory cell arrays 62-1, 62-2, 62-3, - - - 62-N. The actual voltages supplied to the memory cell arrays 62-1, 62-2, 62-3, - - - 62-N are thus lower than the second internal reduced power voltage Vint2. For example, the memory cell arrays 62-1, 62-2, 62-3, - - - 62-N are supplied with voltages Vint21, Vint22, Vint23, - - - Vint2N which have been transmitted through the second interconnection from the first internal reduced voltage generation circuit 91.

The memory cell arrays 62-1, 62-2, 62-3, - - - 62-N have the same circuit configuration, for which reason only the circuit configuration of the memory cell array 62-1 will be described whilst the circuit configuration of the other memory cell arrays 62-2, 62-3, - - - 62-N will be omitted. The memory cell array 62-1 has a plurality of alignments of memory cells MC, sense amplifiers SA for every alignments of the memory cells MC, a plurality of word lines WL and a plural pairs of memory cell digit lines DT and DN or bit lines. Each of the memory cell MC is positioned at one of cross points of the word lines WL and the memory cell digit lines DT. The memory cell MC is connected to both one word line WL and one memory cell digit line DT, a crossing point of which is a position where the memory cell MC is provided. For example, a memory cell MC0 is connected to both a word line WL0 and a memory cell digit line DT0. Although illustration is omitted, memory cells are provided which are connected to the memory cell digit lines DN.

Further, sense amplifier digit lines BT and BN are also provided. The sense amplifier digit lines BT and BN are connected in series through n-channel MOS field effect transistors Q7 to the memory cell digit lines DT and DN. Gates of the n-channel MOS field effect transistors Q7 are connected to a gate control line TG. For example, the sense amplifier digit line BT0 is connected through the n-channel MOS field effect transistor Q7 to the memory cell digit line DT0. The sense amplifier digit line BN0 is connected through the n-channel MOS field effect transistor Q7 to the memory cell digit line DN0.

Each of the sense amplifiers SA is connected to a corresponding pair of the sense amplifier digit lines BT and BN. For example, the sense amplifier SA0 is connected to the sense amplifier digit lines BT0 and BN0.

All of the sense amplifiers SA are connected to power supply lines SAP and SAN. The power supply line SAN is connected in series to a ground line through an n-channel MOS field effect transistor 64 having a gate, to which a control signal ΦSAN. This ground line supplies a ground potential as a reference voltage GND.

The other power supply line SAP is connected through a p-channel MOS field effect transistor Q9 and the first interconnection to the first internal reduced voltage generation circuit 61. The p-channel MOS field effect transistor Q9 has a gate receiving a first control signal ΦSAP1. Namely, the voltage Vint11, which is lower than the first internal reduced power voltage Vint1, is supplied through the p-channel MOS field effect transistor Q9 to the memory cell array 62-1. The other power supply line SAP is also connected through a p-channel MOS field effect transistor Q10 and the second interconnection to the second internal reduced voltage generation circuit 91. The p-channel MOS field effect transistor Q10 has a gate receiving a second control signal ΦSAP2. Namely, the voltage Vint21, which is lower than the second internal reduced power voltage Vint2, is supplied through the p-channel MOS field effect transistor Q10 to the memory cell array 62-1.

Each of the sense amplifiers SA is operated to sense a potential difference or a voltage difference between the paired sense amplifier digit lines BT and BN connected with the sense amplifier SA so that the sense amplifier SA is then operated to amplify the sensed potential difference.

The following descriptions will focus on operations of the above over-drive dynamic semiconductor memory device shown in FIG. 4. FIG. 5 is a waveform explaining operations of the over-drive dynamic semiconductor memory device shown in FIG. 4. The operations of the over-drive dynamic semiconductor memory device shown in FIG. 4 is basically the same as the operation of the dynamic semiconductor memory device shown in FIG. 1, except that voltage supplied onto the power supply line is different between the sense amplification operation and re-store operation. Namely, for the sense amplification operation, a second internal reduced voltage level Vint2 is supplied whilst for the re-store operation, the first internal reduced voltage level Vint1 which is lower than the second internal reduced voltage level Vint2 is reduced. The detailed descriptions will be made hereafter.

When one of the word lines WL, for example, the word line WL0 is selected, a potential of the selected word line WL0 is increased up to a predetermined level, whereby the transistor of the memory cell MC0 turns ON to allow stored information in the memory cell MC0 to be transmitted onto the memory cell digit line DT0. If high level has been stored in the memory cell MC0, as the potential increase of the word line WL0 causes a slight increase in potential of the memory cell digit line DT0. At this time, also the potential of the control line TG connected to the gate of the n-channel MOS field effect transistor Q7 is fixed in high level, and thus the n-channel MOS field effect transistor Q7 between the sense amplifier digit line BT0 and the memory cell digit line DT0 remains in ON state. Therefore, the potential is the same between the memory cell digit line DT0 and the sense amplifier digit line BT0. Accordingly, a potential increase of the memory cell digit line DT0 causes a corresponding potential increase of the sense amplifier digit line BT0.

Thereafter, the potential level of the control line TG connected to the gates of the n-channel MOS field effect transistors Q7 is reduced down to the low level. Further, the second control signal ΦSAP2 applied to the gate of the p-channel MOS field effect transistor Q10 becomes low level to turn the p-channel MOS field effect transistor Q10 ON, whilst the control signal ΦSAN1 applied to the gate of the p-channel MOS field effect transistor Q9 becomes high level to turn the p-channel MOS field effect transistor Q9 OFF. The voltage Vint2 reduced by the parasitic capacitances R21, R22, R23, - - - R2N from the second internal reduced voltage level Vint2 is then supplied through the p-channel MOS field effect transistor Q10 onto the power supply line SAP. The sense amplifier SA is activated to commence its sense operation. The power supply line SAP is connected to the second internal reduced voltage generation circuit Vint21 through the p-channel MOS field effect transistor Q10, for which reason in the sense amplification operation, the power voltage level supplied to the sense amplifier SA0 is the second internal reduced voltage level Vint2 or Vref2. Thus, the sense amplifier SA0 is operated to sense and amplify a slight difference in potential between the paired sense amplifier digit lines BT0 and BN0 connected to the sense amplifier SA0. As a result of the amplification by the sense amplifier SA0, the potential of the sense amplifier digit line BT0 becomes close to the internal reduced voltage level Vref2, whilst the potential of the sense amplifier digit line BN0 becomes close to the reference voltage GND. Once the potentials of the sense amplifier digit lines BT0 and BN0 reach the internal reduced voltage level Vref2 and the reference voltage GND respectively, the sense amplification operation is completed. At the same time when the sense amplification operation is completed, the potential of the control line TG is risen up to the predetermined level to turn the n-channel MOS field effect transistor Q7 ON. The first control signal ΦSAP1 applied to the gate of the p-channel MOS field effect transistor Q9 becomes low level to turn the p-channel MOS field effect transistor Q9 ON, whilst the second control signal ΦSAP2 applied to the gate of the p-channel MOS field effect transistor Q10 becomes high level to turn the p-channel MOS field effect transistor Q10 OFF. The voltage Vint11 reduced by the parasitic capacitances R11, R12, R13, - - - R1N from the first internal reduced voltage level Vint1 is then supplied through the p-channel MOS field effect transistor Q9 onto the power supply line SAP. The paired memory cell digit lines DT0 and DN0 are made connected to the paired sense amplifier digit lines BT0 and BN0 respectively, whereby re-store operation is carried out to re-write data into a capacitor of the memory cell MC0. As a result of the rewriting operation, the potential of the memory cell digit line DT0 is made close to the internal reduced voltage Vref1, whilst the potential of the memory cell digit line DN0 reaches the reference voltage GND, whereby charges are accumulated in the capacitor of the memory cell MC0.

The over-drive system allows a higher power voltage to be supplied to the memory cells in the sense amplification operation for ensuring high speed performance and also allows a lower power voltage to be supplied to the memory cells in the re-store operation for improvement in the reliability of the memory cells and also for reduction in charge and discharge currents flowing on the memory cell digit lines hereby to reduce power consumption.

The above described conventional over-drive system is, however, engaged with the following problems. It is necessary that the two internal reduced power voltage generation circuits are connected through first and second interconnections to each of the memory cell arrays. This means that the necessary area for layout of the interconnections interconnecting the internal reduced power voltage generator circuit and the individual memory cell arrays is double of the over-drive free dynamic semiconductor memory device.

Further, each of the memory cell arrays has two transistors which are connected through the two interconnections to the two internal reduced power voltage generation circuits. This means that the necessary area for layout of the transistors connected through the interconnections to the internal reduced power voltage generation circuits is double of the overdrive free dynamic semiconductor memory device.

In the above circumstances, it had been required to develop a novel sense amplifier driver circuit free from the above problem.

SUMMARY OF THE INVENTION

Accordingly, it is an object of the present invention to provide a novel sense amplifier driver circuit free from the above problems.

It is a further object of the present invention to provide a novel sense amplifier driver circuit which allows the sense amplifier to exhibit a high speed sense amplification operation.

It is a still further object of the present invention to provide a novel sense amplifier driver circuit which allows memory cells to exhibit a high speed re-store or re-write operation.

It is yet a further object of the present invention to provide a novel sense amplifier driver circuit which allows a reduction of the necessary layout area.

The present invention provides a sense amplifier driver circuitry connected to a power voltage supply line supplying a power voltage and also connected to a driving voltage supply line supplying a driving voltage. The driver circuitry comprises: a first circuit having a first input terminal receiving at least a first reference voltage and a second input terminal connected to the driving voltage supply line for feeding the driving voltage back to the second input terminal for comparing the driving voltage with the reference voltage, and the first circuit having an output terminal for outputting an output voltage which accords to a difference in potential between the driving voltage and the reference voltage; a switching device connected between the power voltage supply line and driving voltage supply line, the switching device having a control terminal connected to the output terminal of the first circuit for receiving the output voltage so that the switching device performs ON-OFF switching operations in accordance with the output voltage; and a high speed driving device connected to the control terminal of the switching device for turning the switching device ON at a higher speed than when the switching device turns ON in accordance with the output voltage from the first circuit.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
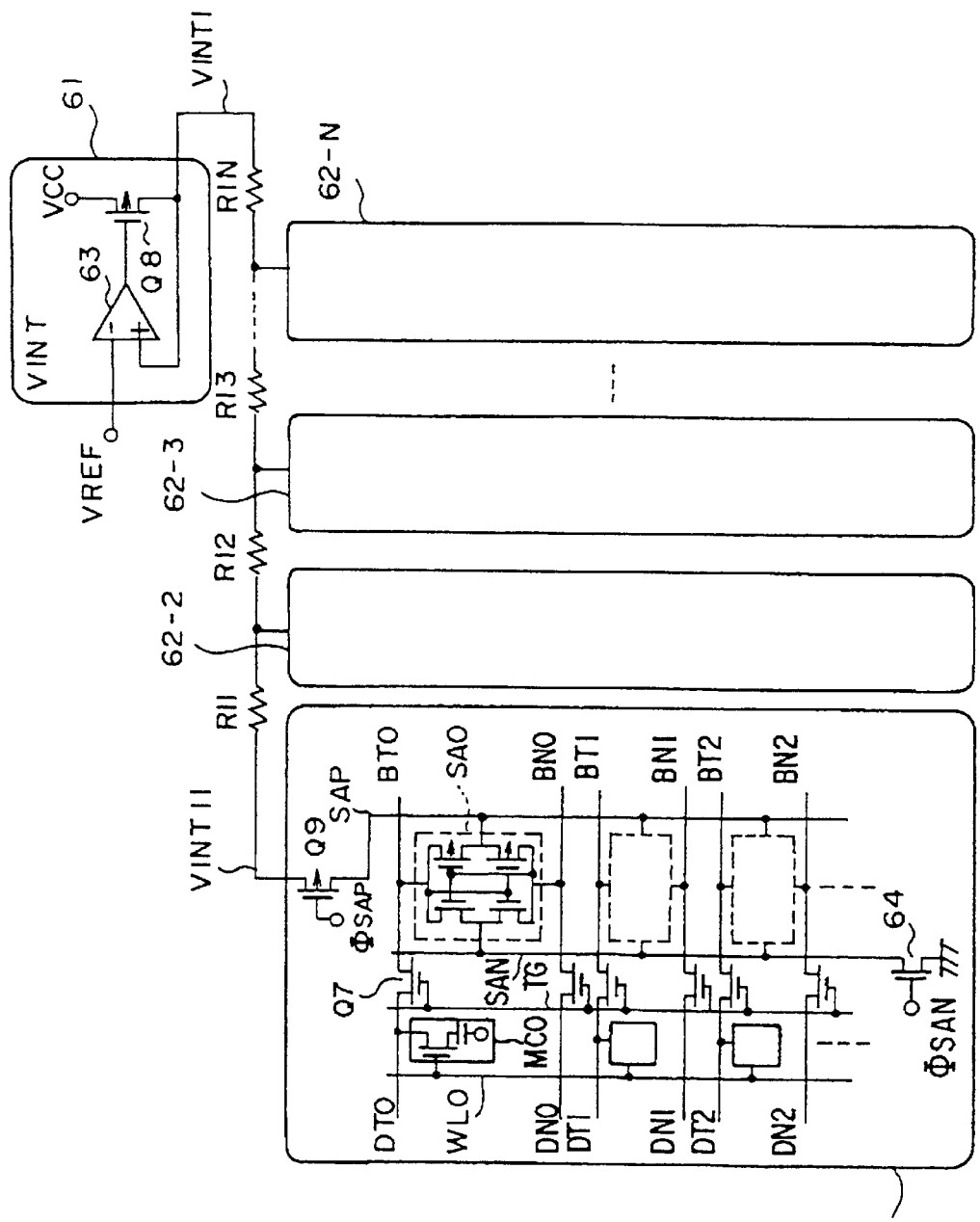
FIG. 1 is a block diagram illustrative of a circuit configuration of the general dynamic semiconductor memory device, where an external power voltage is reduced for subsequent supply to memory cell arrays
Figure 2:
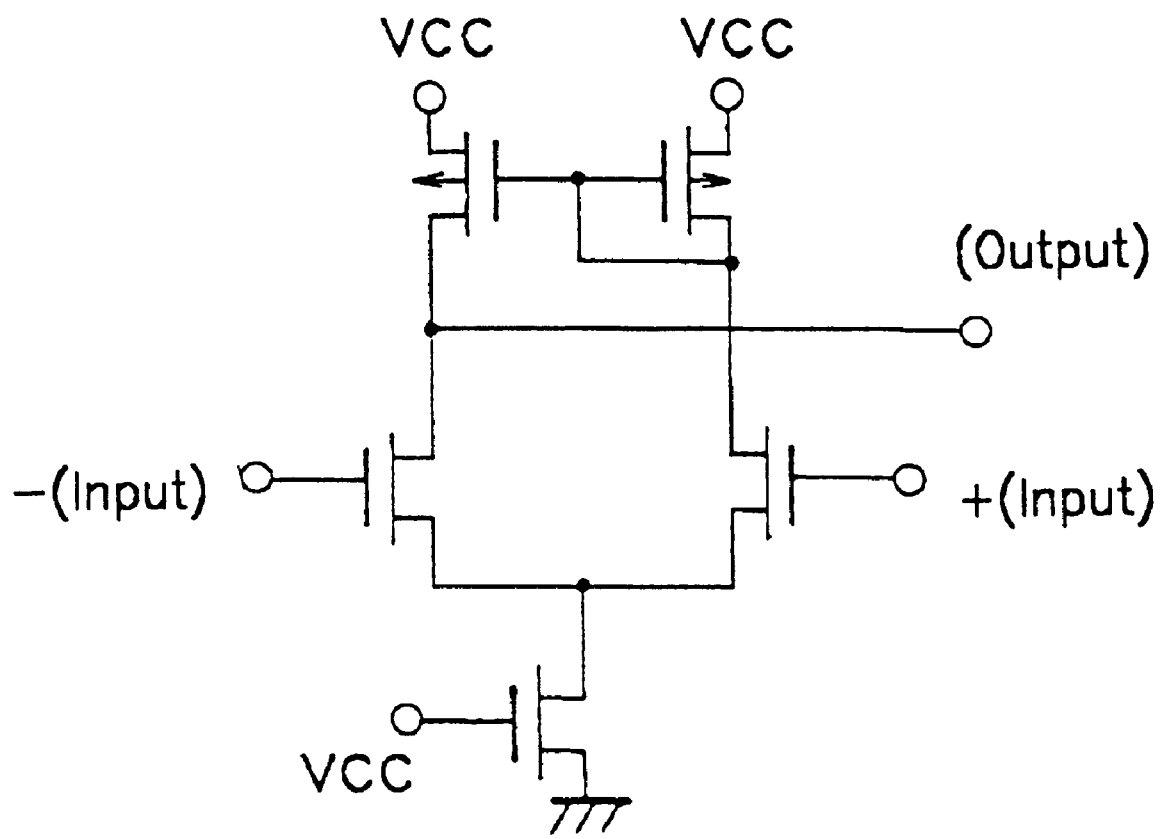
FIG. 2 is a circuit diagram illustrative of a differential amplifier circuit in the internal reduced voltage generation circuit shown in FIG. 1.

The present invention provides a driver circuitry connected to a power voltage supply line supplying a power voltage and also connected to a driving voltage supply line supplying a driving voltage. The driver circuitry comprises: a first circuit having a first input terminal receiving at least a first reference voltage and a second input terminal connected to the driving voltage supply line for feeding the driving voltage back to the second input terminal for comparing the driving voltage with the reference voltage, and the first circuit having an output terminal for outputting an output voltage which accords to a difference in potential between the driving voltage and the reference voltage; a switching device connected between the power voltage supply line and driving voltage supply line, the switching device having a control terminal connected to the output terminal of the first circuit for receiving the output voltage so that the switching device performs ON-OFF switching operations in accordance with the output voltage; and a high speed driving device connected to the control terminal of the switching device for turning the switching device ON at a higher speed than when the switching device turns ON in accordance with the output voltage from the first circuit.

It is preferable that the fist circuit comprises a differential amplifier, the switching device comprises a first conductivity type channel field effect transistor being connected in series between the power voltage supply line and driving voltage supply line and having a gate electrode as the control terminal, and the high speed driving device is operated to form a short circuit between the gate electrode and a base voltage supply line supplying a base voltage level necessary for turning the first conductivity type channel field effect transistor ON.

It is further preferable that the first conductivity type channel field effect transistor comprises a first p-channel field effect transistor, and the base voltage level is not higher than a ground level.

It is furthermore preferable that the high speed driving device comprises a first n-channel field effect transistor connected in series between the gate electrode of the first p-channel field effect transistor and the base voltage supply line.

It is preferable to further comprise: a second p-channel field effect transistor connected in series between the gate electrode of the first p-channel field effect transistor and the power voltage supply line ; and a second n-channel field effect transistor connected in series between the differential amplifier and the base voltage supply line, and the second n-channel field effect transistor having a gate electrode connected to a gate electrode of the second p-channel field effect transistor, so that the gate electrodes of the second p-channel field effect transistor and the second n-channel field effect transistor are operated in accordance with the same gate signal.

It is also preferable that the driving voltage supply line is connected with a sense amplifier, so that the driver circuitry is operated to drive the sense amplifier.

It is further preferable that the driver circuitry and the sense amplifier are provided in a memory cell array of a semiconductor memory device.

It is preferable to further comprise a reference voltage selecting device connected to a control line extending through the memory cell array and also connected to the first input terminal of the first circuit for selecting one of plural reference voltages different from each other in accordance with a logic level of the control line in order to supply the selected one of the plural reference voltages to the first input terminal as a reference voltage.

It is further preferable that when the semiconductor memory device is about to enter into any one of a sense amplification operation and a re-store operation, the high speed driving device receives one shot pulse signal to turn the switching device ON upon receipt of the one shot pulse signal.

It is also preferable that the high speed driving device receives one shot pulse signal to turn the switching device ON upon receipt of the one shot pulse signal.

The present invention also provides a memory cell array having: a plurality of memory cells; a plurality of sense amplifiers; a plurality of word lines connected to the memory cells; plural sets of first and second digit lines connected to each other through digit line switching devices, and the first digit lines being connected to the memory cells, and the second digit lines being connected to the sense amplifiers; a control line connected to control terminals of the digit line switching devices; a driving voltage supply line connected with the sense amplifiers for supplying a driving voltage to the sense amplifiers; a sense amplifier driving circuit connected between the driving voltage supply line and a power voltage line for supplying a power voltage which is higher than the driving voltage, wherein the sense amplifier driving circuit has a circuit configuration of the above present invention.

The present invention also provides a semiconductor memory device comprising: a single power voltage supply line for supplying a power voltage; and a plurality of memory cell arrays connected in parallel to the single power voltage supply line, wherein each of the memory cell arrays comprises a circuit configuration of the above present invention

PREFERRED EMBODIMENT

Figure 6:
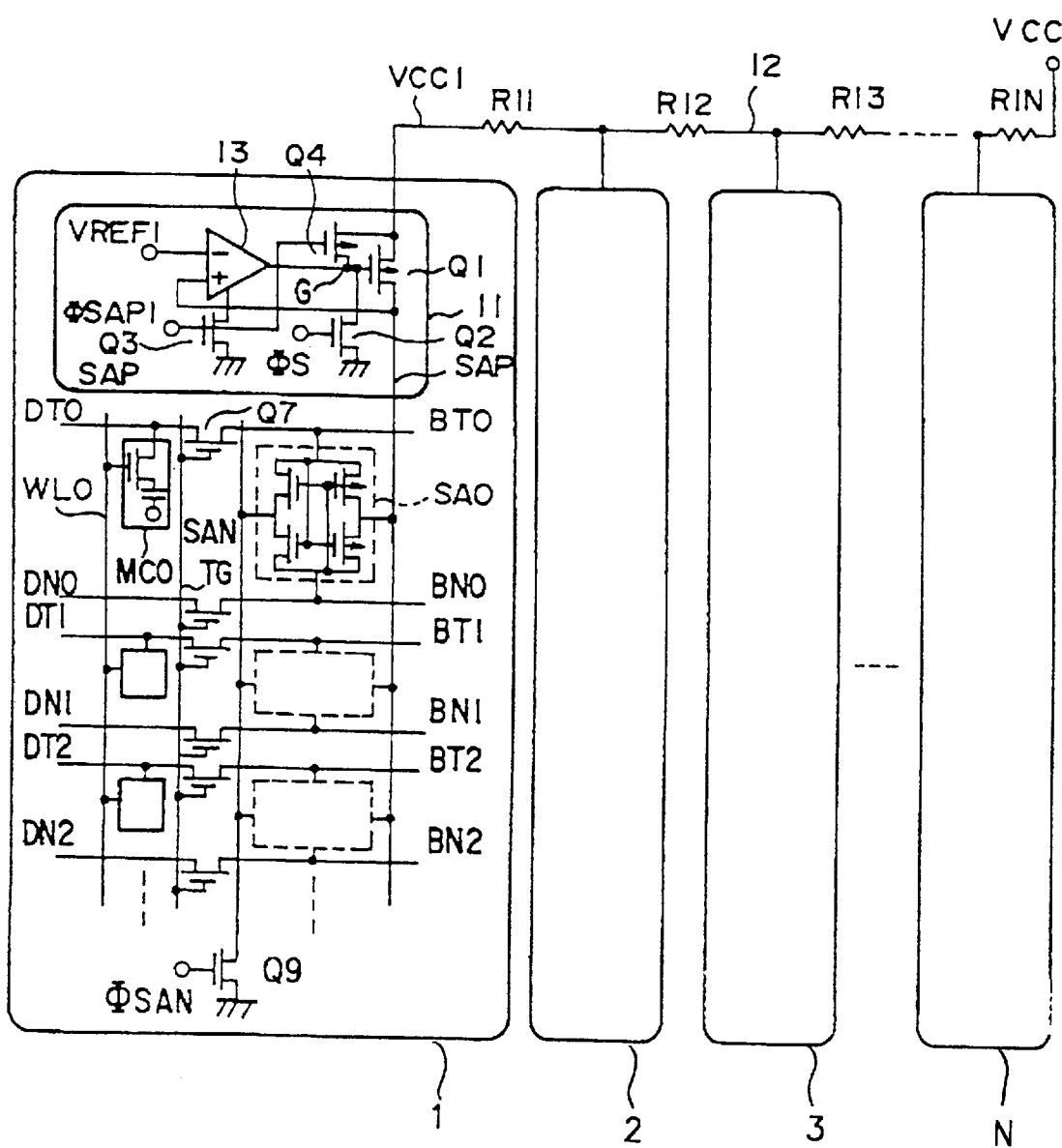
FIG. 6 is a block diagram illustrative of a novel circuit configuration of a dynamic semiconductor memory device, where an external power voltage is reduced for subsequent supply to memory cell arrays, in a first embodiment in accordance with the present invention.

A first embodiment according to the present invention will be described in detail with reference to the drawings. FIG. 6 is a block diagram illustrative of a novel circuit configuration of a dynamic semiconductor memory device, where an external power voltage is reduced for subsequent supply to memory cell arrays, in a first embodiment in accordance with the present invention.

A dynamic semiconductor memory device comprises a plurality of memory cell arrays 1, 2, 3, - - - N, which are connected in parallel to a power voltage supply line 12 which supplies a power voltage Vcc. The power voltage supply line 12 has parasitic resistances R11, R12, R13, - - - R1N, for which reason individuals of said memory cell arrays 1, 2, 3, - - - N receive different power voltage levels from each other. For example, a first memory cell array 1 receives a first power voltage Vcc1 which is reduced from the power voltage level Vcc by a total amount of the parasitic resistances R11, R12, R13, - - - R1N.

Each of the memory cell arrays 1, 2, 3, - - - N have the same circuit configuration, for which reason the following description is highlighted on the circuit configuration of the first memory cell array 1 whilst descriptions of the circuit configurations of the other memory cell arrays 2, 3, - - - N will be omitted.

The first memory cell array 1 is connected with the power voltage supply line 12 which has the parasitic capacitances R11, R12, R13, - - - R1N so that the first memory cell array 1 receives the first power voltage Vcc1 which is reduced from the power voltage Vcc by the total amount of the parasitic resistances R11, R12, R13, - - - R1N. The first memory cell array 1 has an array of memory cells MC, a plurality of word lines WL, a plurality of memory cell side digit lines DT0, DN0, DT1, DN1, - - - . Each of the memory cells MC comprises a memory capacitor for storing data and a switching transistor connected in series between the memory cell side digit line DT and the memory capacitor, wherein a gate of the switching transistor is connected to the word line WL.

The first memory cell array 1 further has an array of sense amplifiers SA0, SA1, SA2, - - - , and a plurality of sense amplifier side digit lines BT0, BN0, BT1, BN1, - - - connected to the sense amplifiers SA0, SA1, SA2 - - - , respectively. The sense amplifier side digit lines BT0, BN0, BT1, BN1, - - - are connected in series through n-channel field effect transistors Q7 to the memory cell side digit lines DT0, DN0, DT1, DN1, - - - , so as to make plural pairs of the sense amplifier side digit lines BT0, BN0, BT1, BN1, - - - , and memory cell side digit lines DT0, DN0, DT1, DN1, - - - , respectively. For example, the memory cell side digit line DT0 and the sense amplifier side digit line BT0 are connected to each other through the n-channel field effect transistor Q7 to make a first pair. The memory cell side digit line DN0 and the sense amplifier side digit line BN0 are connected to each other through the n-channel field effect transistor Q7 to make a second pair. A first sense amplifier SA0 in the sense amplifier array is positioned between the sense amplifier side digit lines BT0 and BN0 and is connected to both the sense amplifier side digit lines BT0 and BN0.

The first memory cell array 1 further has a first driving voltage supply line SAP supplying a first driving voltage which is reduced from the power voltage Vcc, and a second driving voltage supply line SAN supplying a second driving voltage. Each of the sense amplifiers SA0, SA1, SA2, - - - is connected to both the first and second driving voltage supply lines SAP and SAN. The second driving voltage supply line SAN is connected through an n-channel field effect transistor Q9 to a ground line. A gate of the n-channel field effect transistor Q9 is applied with a gate control signal ΦSAN. The first memory cell array 1 further has a control line TG which supplies a control signal. The control line TG is connected to gate electrodes of the n-channel field effect transistors Q7 interconnecting, in series, the memory cell side digit lines DT0, DN0, DT1, DN1, - - - , and the sense amplifier side digit lines BT0, BN0, BT1, BN1, - - - , so that the n-channel field effect transistors Q7 perform ON-OFF operations under the control signal from the control line TG. The circuit configuration of the sense amplifiers is the same as the conventional one.

In accordance with the novel circuit configuration of the dynamic semiconductor memory device, each of the memory cell arrays furthermore has a sense amplifier driving circuit. For example, the first memory cell array 1 has a first sense amplifier driving circuit 11. The first sense amplifier driving circuit 11 is connected between the power voltage supply line 12 and the first driving voltage supply line SAP. The first sense amplifier driving circuit 11 has a differential amplifier 13 having a first input terminal receiving a first reference voltage Vref1 and a second input terminal connected to the first driving voltage supply line SAP for allowing the first driving voltage to be fed back to the second input terminal, so that the differential amplifier 13 is operated to compare the fed-back first driving voltage level to the first reference voltage Vref1 and amplify a difference between the first driving voltage level and the first reference voltage Vref1, so that the differential amplifier 13 is operated to output an output voltage which accords to the difference between the first driving voltage level and the first reference voltage Vref1. The differential amplifier 13 has an output terminal from which the output voltage is outputted. The output terminal of the differential amplifier 13 is connected to a node G, wherein the node G has the same potential as the output voltage from the differential amplifier 13. The first sense amplifier driving circuit 11 further has a first p-channel MOS field effect transistor Q1 having a gate electrode connected to the node G which is connected to the output terminal of the differential amplifier 13 for allowing the gate electrode of the first p-channel MOS field effect transistor Q1 to receive the output voltage from the differential amplifier 13. The first p-channel MOS field effect transistor Q1 is connected in series between the power voltage supply line 12 and the first driving voltage supply line SAP. The first sense amplifier driving circuit 11 further has a first n-channel MOS field effect transistor Q2 which is connected in series between the node G and a ground line supplying a ground voltage. The first n-channel MOS field effect transistor Q2 has a gate electrode which receives a gate control signal ΦS. The first sense amplifier driving circuit 11 further has a second n-channel MOS field effect transistor Q3 connected between the ground line and the differential amplifier 13. The second n-channel MOS field effect transistor Q3 has a gate electrode which receives a gate control signal ΦSAP1. The first sense amplifier driving circuit 11 further has a second p-channel MOS field effect transistor Q4 connected between the node G and the power voltage supply line 12. The second p-channel MOS field effect transistor Q4 has a gate electrode which receives the gate control signal ΦSAP1. Namely, the second n-channel MOS field effect transistor Q3 and the second p-channel MOS field effect transistor Q4 receive the same gate control signal ΦSAP1.

Figure 7:
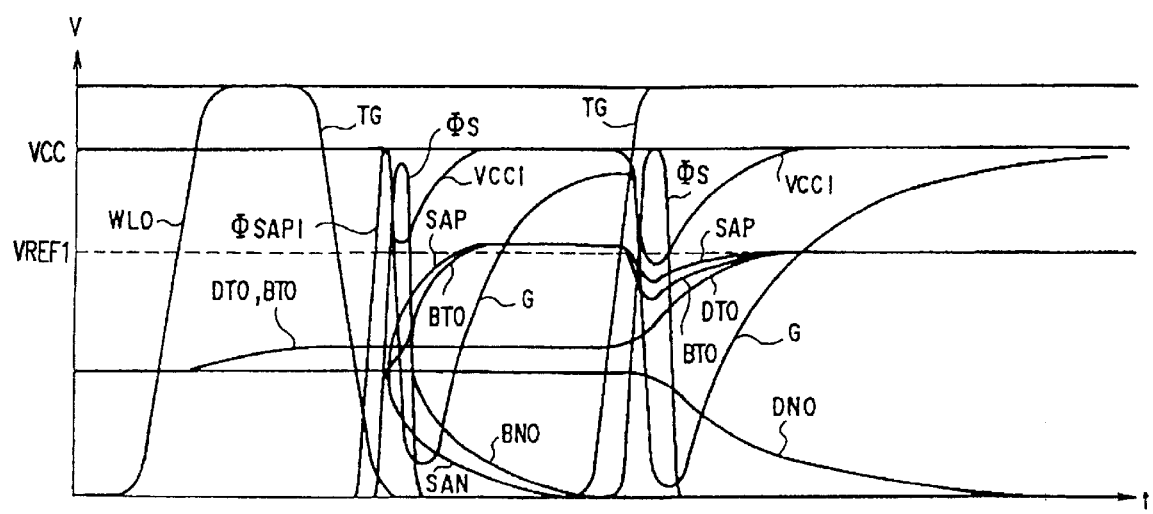
FIG. 7 is a waveform explaining operations of the dynamic semiconductor memory device shown in FIG. 6.

The following descriptions will be made for operations of the above novel dynamic semiconductor memory device. FIG. 7 is a waveform explaining operations of the dynamic semiconductor memory device shown in FIG. 6. Operations of the individual memory cell arrays 1, 2, 3, - - -, N are the same as each other, for which reason the description will focus on the operation of the first sense amplifier driving circuit 11 in the first memory cell array.

When a potential of the word line WL0 is risen up to a predetermined level, a datum stored in the memory cell MC0 is transmitted onto the memory cell side digit line DT0, If the datum stored in the memory cell MC0 is high level, the potential of the memory cell side digit line DT0 is slightly increased. At this time, the control line TG is high level, then the n-channel MOS field effect transistor Q7 is ON-state, whereby the sense amplifier side digit line BT0 is conductive to the memory cell side digit line DT0, and thus the potential of the sense amplifier side digit line BT0 is also slightly increased.

Thereafter, the control line TG is made into low level, whilst the control signal ΦSAP1 is made into high level, so that the first sense amplifier driving circuit 11 is activated. At this time, the control signal ΦS applied to the gate of the first n-channel MOS field effect transistor Q2 is made into high level by one shot to turn the first n-channel MOS field effect transistor Q2 ON, so that the node G is made conductive the ground line, whereby the potential of the node G is rapidly drop from the high level Vcc to the low level. This rapid drop in potential of the node G causes the first n-channel MOS field effect transistor Q2 to rapidly turn ON at a high speed, whereby the first driving voltage supply line SAP is made conductive to the power voltage supply line 12 and thus the first driving voltage supply line SAP is risen in potential rapidly to the high voltage level. The second input terminal of the differential amplifier 13 is connected to the first driving voltage supply line SAP for feeding the potential level of the first driving voltage supply line SAP back to the second input terminal of the differential amplifier 13, for which reason this rapid increase in potential of the first driving voltage supply line SAP causes a rapid increase in potential of the output voltage from the differential amplifier 13, whereby the node G connected to the output terminal of the differential amplifier 13 is also rapidly increased in potential. After the potential of the first driving voltage supply line SAP had been made higher than the reference voltage level Vref1 and a sense operation of the sense amplifier has been completed, then the potential of the node G remains continued to be increased up to a high level which turns the first p-channel MOS field effect transistor Q1 OFF.

Thereafter, the potential of the control line TG is risen to commence the re-store operation. At this time, concurrently, the control signal ΦS applied to the first p-channel MOS field effect transistor Q1 is made into the high level again by one shot to drop the potential of the node G. Rising the potential of the control line TG turns the n-channel MOS field effect transistor Q7 ON to make the memory cell side digit line DT) conductive to the sense amplifier side digit line BT0, whereby the sense amplifier side digit line BT0 drops in potential and also the first driving voltage supply line SAP is also dropped in potential. However, the drop in potential of the node G turns the first p-channel MOS field effect transistor Q1 ON, whereby the first driving voltage supply line SAP is made conductive to the power voltage supply line 12. As a result, the drop in potential of the first driving voltage supply line SAP is suppressed, whereby a high speed re-store operation is performed.

After the potential of the first driving voltage supply line SAP had been made higher than the reference voltage level Vref1, then the potential of the node G remains continued to be increased up to a high level which turns the first p-channel MOS field effect transistor Q1 OFF before the re-store operation is completed.

The above novel circuit configuration of the sense amplifier driving circuit 11 provides the following advantages.

Figure 3:
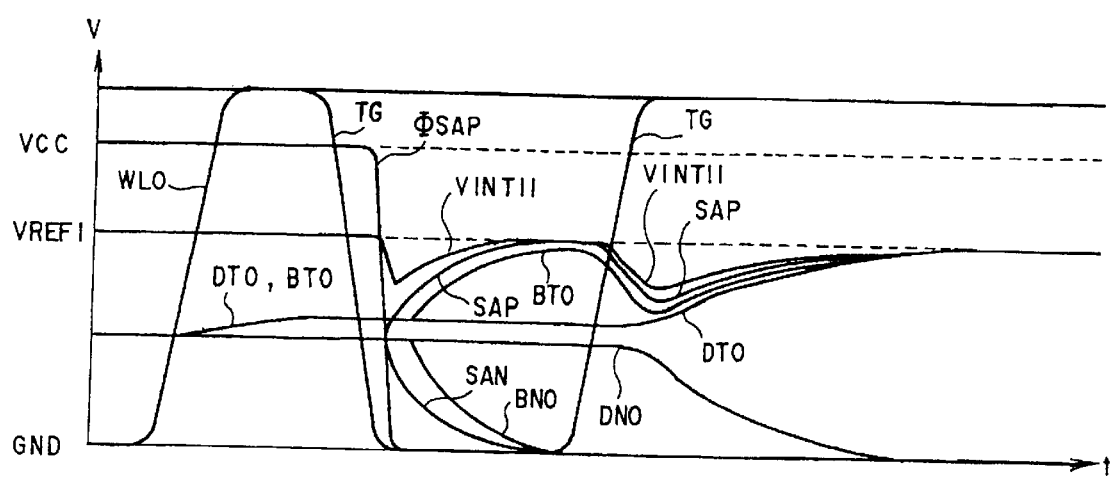
FIG. 3 is a waveform explaining operations of the dynamic semiconductor memory device shown in FIG. 1.
Figure 4:
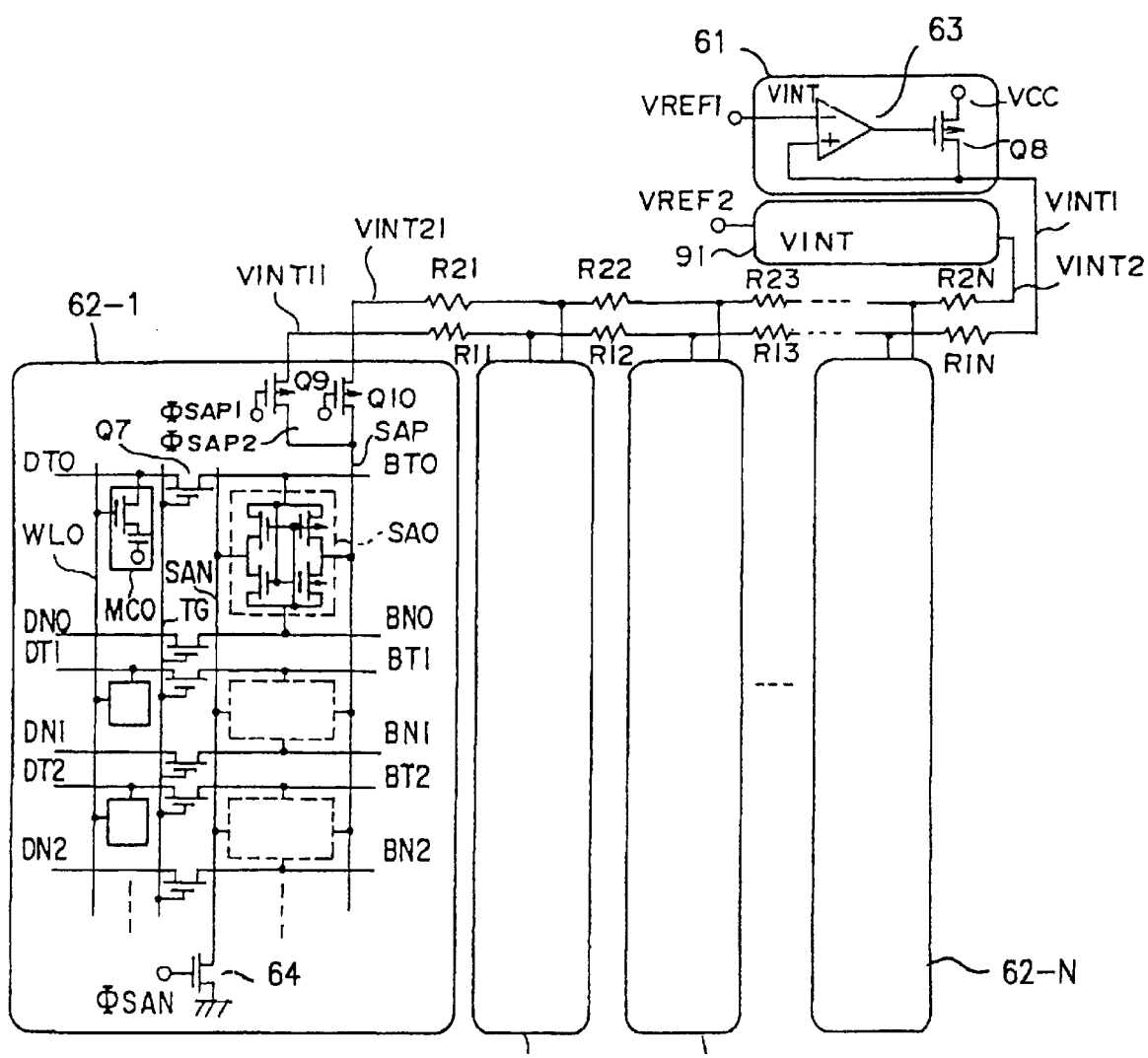
FIG. 4 is a block diagram illustrative of a circuit configuration of the dynamic semiconductor memory device operable in over-drive system.
Figure 5:
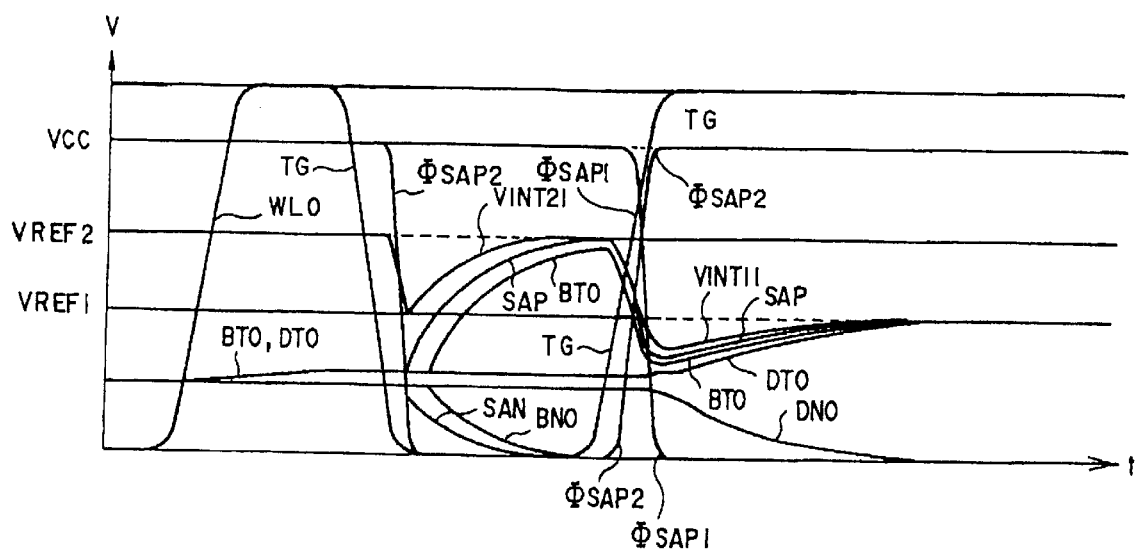
FIG. 5 is a waveform explaining operations of the over-drive dynamic semiconductor memory device shown in FIG. 4.

The first p-channel MOS field effect transistor Q1 has a source connected to the power voltage supply line 12 and a drain connected to the first driving voltage supply line SAP, for which reason the source is applied with the power voltage level Vcc whilst the drain is applied with the first driving voltage level. As can been seen from FIG. 7, a source-drain voltage of the first p-channel MOS field effect transistor Q1 in the sense amplification operation or in the re-store operation is much larger than that of the conventional one shown in FIG. 3. This means that the first p-channel MOS field effect transistor Q1 has a sufficiently large driving capability even the size of the transistor is small as compared to the conventional one. This may reduce the necessary layout area and also allows the sense amplifier to exhibit high speed sense amplification operation and also high speed re-store operation.

The above novel sense amplifier driving circuit 11 has a simple circuit configuration which comprises the output terminal of the differential amplifier 13 is directly connected to the gate electrode of the first p-channel MOS field effect transistor Q1 which drives the first driving voltage supply line SAP. It is possible to reduce the size of the transistors of the differential amplifier 13. The layout areas of all of the circuit devices except for the first p-channel MOS field effect transistor Qi may be reduced, so that no substantial increase in layout area is caused as compared to the conventional circuit configuration.

The parasitic resistances of the power voltage supply line 12 drop the first power voltage Vcc1 from the power voltage Vcc in the sense amplifier operation or in the re-store operation. Notwithstanding, there remains a sufficient potential difference between the first power voltage Vcc1 and the first driving voltage of the first driving voltage supply line SAP, for which reason a large current can be supplied to the first driving voltage supply line SAP. This means that even the parasitic resistance is present on the power voltage supply line 12, almost no delay in operational speed of the sense amplifier operation or the re-store operation is caused, whereby it is possible to narrow the line width as compared to the conventional one- This allows a further reduction in area of the line layout.

Further, the first n-channel MOS field effect transistor Q2 is provided in order to rapidly turn the first p-channel MOS field effect transistor Q1 ON by one shot in the sense amplification operation and the re-store operation independently, however, from the output voltage from the differential amplifier 13, whereby the in commencement of either the sense amplification operation or the re-store operation, the potential of the node G is rapidly dropped to rapidly turn the first p-channel MOS field effect transistor Q1 ON even a power consumption of the differential amplifier 13 is small.

Whereas the above novel sense amplifier driving circuit 11 was applied to the general dynamic semiconductor memory device, the above novel sense amplifier driving circuit 11 may be modified to be applicable to the over-driving dynamic semiconductor memory device.

Figure 8:
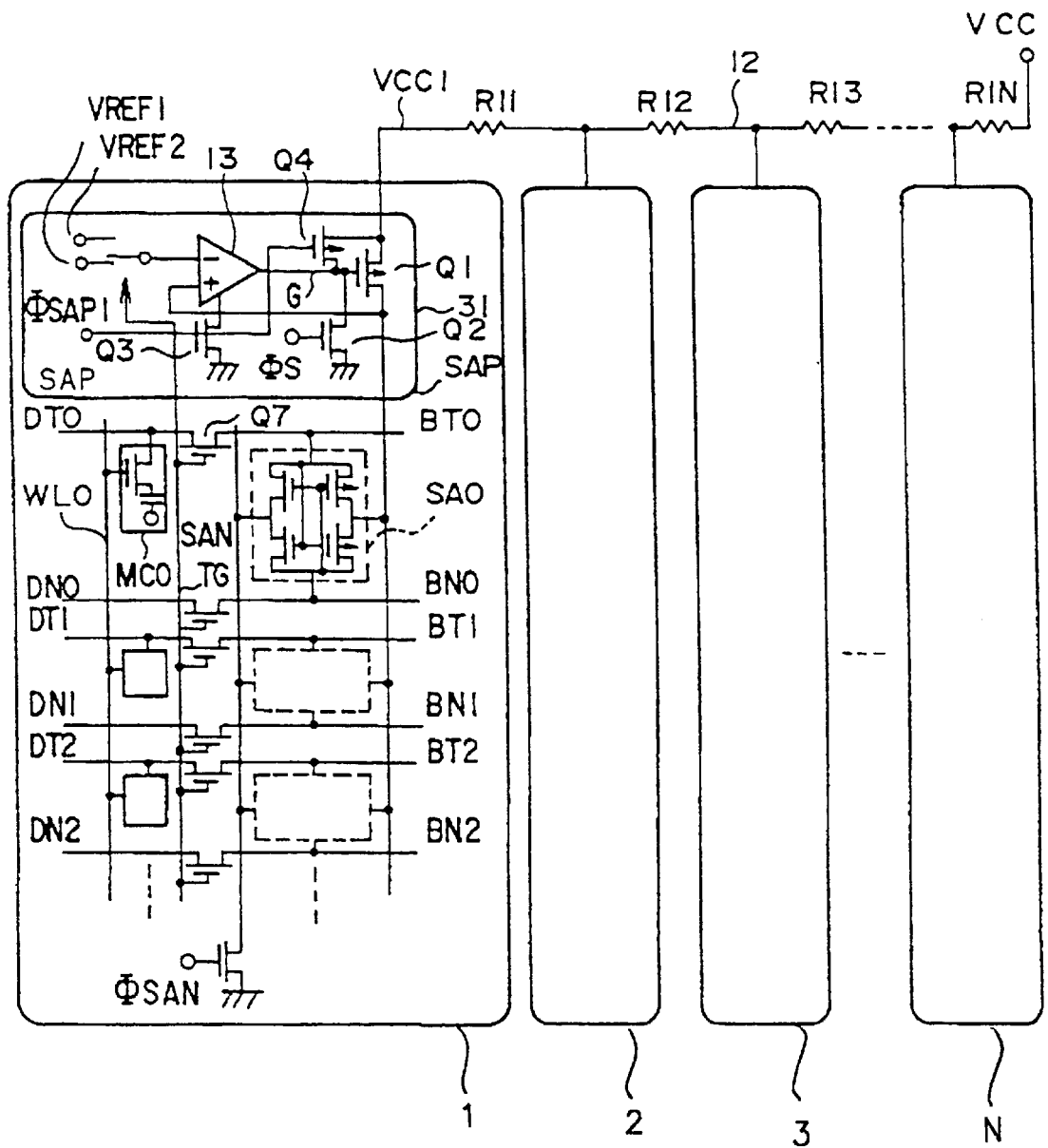
FIG. 8 is a block diagram illustrative of a modified novel circuit configuration of an over-driving dynamic semiconductor memory device, where an external power voltage is reduced for subsequent supply to memory cell arrays, in a first embodiment in accordance with the present invention.

FIG. 8 is a block diagram illustrative of a modified novel circuit configuration of an over-driving dynamic semiconductor memory device, where an external power voltage is reduced for subsequent supply to memory cell arrays, in a first embodiment in accordance with the present invention.

A modified novel sense amplifier driver circuit 31 has the same circuit configuration except that selected one of different two reference voltages Vref1 and Vref2 is applied to the first input terminal of the differential amplifier 13 for realizing the over-diving system, where selection of the different two reference voltages Vref1 and Vref2 is made in accordance with the control voltage of the control line TG.

Figure 9:
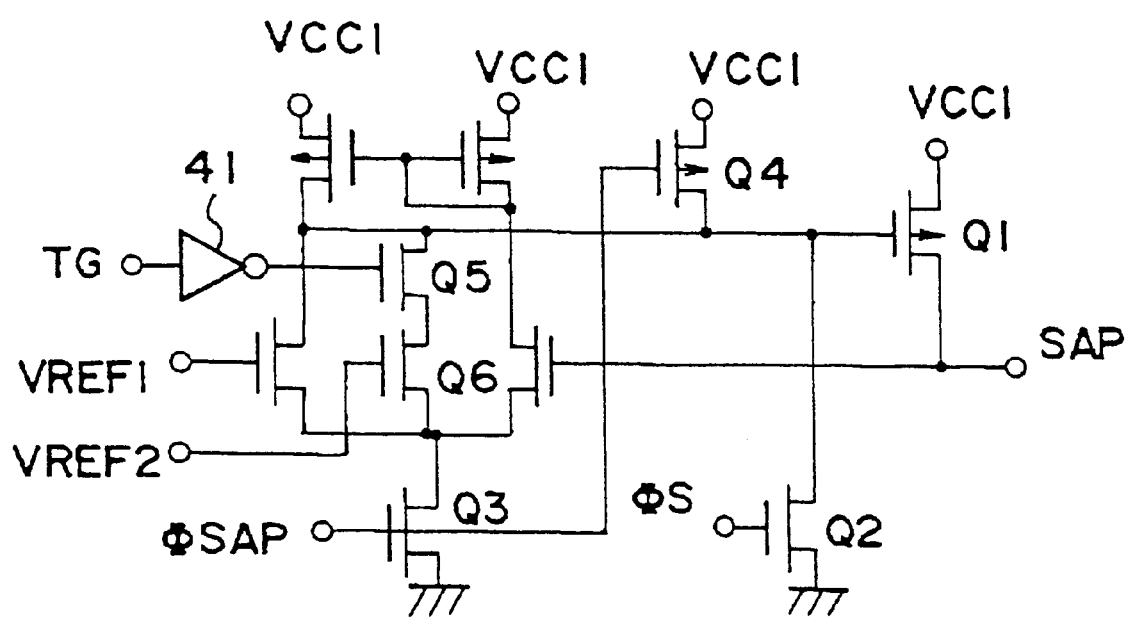
FIG. 9 is a circuit diagram illustrative of the above modified is sense amplifier driving circuit shown in FIG. 8.

FIG. 9 is a circuit diagram illustrative of the above modified sense amplifier driving circuit shown in FIG. 8. In this modified sense amplifier driving circuit 31, two n-channel MOS field effect transistors Q5 and Q6 are provided in addition to the differential amplifier 13 so that the additionally provided two n-channel MOS field effect transistors Q5 and Q6 serve as a switching device for selecting any one of the different two reference voltages Vref1 and Vref2 to apply the selected one into the first input terminal of the differential amplifier 13. Namely, the first input terminal of the differential amplifier 13 is applied with a relatively low reference voltage Vref1, whilst a gate electrode of the n-channel MOS field effect transistor Q6 is applied with a relatively low reference voltage Vref2. The n-channel MOS field effect transistor Q5 serves as a switching device, so that if the n-channel MOS field effect transistor Q5 is in OFF-state, then the relatively low reference voltage Vref1 only is applied to the first input terminal of the differential amplifier 13. If the n-channel MOS field effect transistor Q5 is in ON-state, then the reference voltage Vref2 is applied to the first input terminal of the differential amplifier 13 in addition to the reference voltage Vref1. The gate electrode of the n-channel MOS field effect transistor Q5 is connected to an output terminal of an inverter 41 having an input terminal connected to the control line TG, so that the control signal is inverted by the inverter 41 and then applied to the gate electrode of the n-channel MOS field effect transistor Q5. Since the modified novel sense amplifier driving circuit 31 has such a simple circuit configuration as to cause almost no increase in layout area of the circuit.

Figure 10:
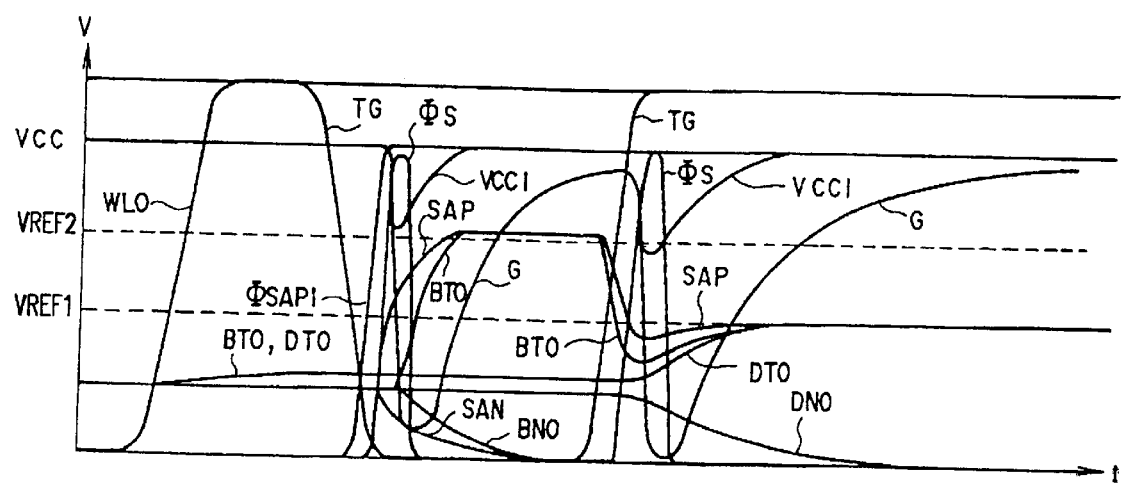
FIG. 10 is a waveform explaining operations of the dynamic semiconductor memory device shown in FIG. 8.

FIG. 10 is a waveform explaining operations of the dynamic semiconductor memory device shown in FIG. 8. When the word line WL0 is selected to increase the potential thereof, the memory cell side digit line DT0 and the sense amplifier side digit line BT0 are slightly increased. In order to commence the sense amplification operation, the control line TG is made into low level, so as to turn the n-channel MOS field effect transistor QS ON, whereby the first input terminal of the differential amplifier 13 is applied with the relatively high reference voltage Vref2. As a result, the first p-channel MOS field effect transistor Q1 remains ON until the potential of the first driving voltage supply line SAP is risen up to the same level as the relatively high reference voltage Vref2. Namely, in the sense amplification operation, the first driving voltage of the first driving voltage supply line SAP is the same as the relatively high reference voltage Vref2.

Thereafter, in order to commence the re-store operation, the control line TG is increased in potential, so as to turn the n-channel MOS field effect transistor Q5 OFF, whereby the reference voltage Vref1 is applied to the first input terminal of the differential amplifier 13. As a result, the potential of the first driving voltage supply line SAP is risen up to the reference voltage Vref2.

Other operations than described above are the same as the above sense amplifier driving circuit 11 shown in FIG. 6, for which reason descriptions of the other operations will be omitted.

The above novel circuit configuration of the sense amplifier driving circuit 31 also provides the following advantages.

The first p-channel MOS field effect transistor Q1 has a source connected to the power voltage supply line 12 and a drain connected to the first driving voltage supply line SAP, for which reason the source is applied with the power voltage level Vcc whilst the drain is applied with the first driving voltage level. A source-drain voltage of the first p-channel MOS field effect transistor Q1 in the sense amplification operation or in the restore operation is much larger than that of the conventional one shown in FIG. 3. This means that the first p-channel MOS field effect transistor Q1 has a sufficiently large driving capability even the size of the transistor is small as compared to the conventional one. This may reduce the necessary layout area and also allows the sense amplifier to exhibit high speed sense amplification operation and also high speed re-store operation.

The above novel sense amplifier driving circuit 31 has a simple circuit configuration which comprises the output terminal of the differential amplifier 13 is directly connected to the gate electrode of the first p-channel MOS field effect transistor Q1 which drives the first driving voltage supply line SAP. It is possible to reduce the size of the transistors of the differential amplifier 13. The layout areas of all of the circuit devices except for the first p-channel MOS field effect transistor Q1 may be reduced, so that no substantial increase in layout area is caused as compared to the conventional circuit configuration.

The parasitic resistances of the power voltage supply line 12 drop the first power voltage Vcc1 from the power voltage Vcc in the sense amplifier operation or in the re-store operation. Notwithstanding, there remains a sufficient potential difference between the first power voltage Vcc1 and the first driving voltage of the first driving voltage supply line SAP, for which reason a large current can be supplied to the first driving voltage supply line SAP. This means that even the parasitic resistance is present on the power voltage supply line 12, almost no delay in operational speed of the sense amplifier operation or the re-store operation is caused, whereby it is possible to narrow the line width as compared to the conventional one. This allows a further reduction in area of the line layout.

Further, the first n-channel MOS field effect transistor Q2 is provided in order to rapidly turn the first p-channel MOS field effect transistor Q1 ON by one shot in the sense amplification operation and the re-store operation independently, however, from the output voltage from the differential amplifier 13, whereby the in commencement of either the sense amplification operation or the re-store operation, the potential of the node G is rapidly dropped to rapidly turn the first p-channel MOS field effect transistor Q1 ON even a power consumption of the differential amplifier 13 is small.

In addition, even the over-driving system is used, the power voltage supply line 12 is the same as shown in FIG. 6. Namely, the use of the over-drive system cause no increase m layout area of the power voltage supply line.

Further, even selected one of the different two reference voltages Vref1 and Vref2 is applied to the differential amplifier 13 for realizing the over-driving system, he necessary number of the p-channel MOS field effect transistor connected to the first driving voltage supply line is only one, for which reason the necessary layout area is the same as that shown in FIG 6.

Accordingly, even the over-drive system is used, almost no increase in the layout area of the circuit is necessary.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A driver circuitry connected to a power voltage supply line supplying a power voltage and also connected to a driving voltage supply line supplying a driving voltage, said driver circuitry comprising:
    a first circuit having a first input terminal receiving at least a first reference voltage and a second input terminal connected to said driving voltage supply line for feeding said driving voltage back to said second input terminal for comparing said driving voltage with said reference voltage, and said first circuit having an output terminal for outputting an output voltage which accords to a difference in potential between said driving voltage and said reference voltage;
    a switching device connected between said power voltage supply line and driving voltage supply line, said switching device having a control terminal connected to said output terminal of said first circuit for receiving said output voltage so that said switching device performs ON-OFF switching operations in accordance with said output voltage; and
    a high speed driving device connected to said control terminal of said switching device for turning said switching device ON at a higher speed than when said switching device turns ON in accordance with said output voltage from said first circuit.

2. The driver circuitry as claimed in claim 1, wherein said first circuit comprises a differential amplifier, said switching device comprises a first conductivity type channel field effect transistor being connected in series between said power voltage supply line and driving voltage supply line and having a gate electrode as said control terminal, and said high speed driving device is operated to form a short circuit between said gate electrode and a base voltage supply line supplying a base voltage level necessary for turning said first conductivity type channel field effect transistor ON.

3. The driver circuitry as claimed in claim 2, wherein said first conductivity type channel field effect transistor comprises a first p-channel field effect transistor, and said base voltage level is not higher than a ground level.

4. The driver circuitry as claimed in claim 3, wherein said high speed driving device comprises a first n-channel field effect transistor connected in series between said gate electrode of said first p-channel field effect transistor and said base voltage supply line.

5. The driver circuitry as claimed in claim 4, further comprising:
    a second p-channel field effect transistor connected in series between said gate electrode of said first p-channel field effect transistor and said power voltage supply line; and
    a second n-channel field effect transistor connected in series between said differential amplifier and said base voltage supply line, and said second n-channel field effect transistor having a gate electrode connected to a gate electrode of said second p-channel field effect transistor, so that said gate electrodes of said second p-channel field effect transistor and said second n-channel field effect transistor are operated in accordance with the same gate signal.

6. The driver circuitry as claimed in claim 1, wherein said driving voltage supply line is connected with a sense amplifier, so that said driver circuitry is operated to drive said sense amplifier.

7. The driver circuitry as claimed in claim 6, wherein said driver circuitry and said sense amplifier are provided in a memory cell array of a semiconductor memory device.

8. The driver circuitry as claimed in claim 7, further comprising a reference voltage selecting device connected to a control line extending through said memory cell array and also connected to said first input terminal of said first circuit for selecting one of plural reference voltages different from each other in accordance with a logic level of said control line in order to supply said selected one of said plural reference voltages to said first input terminal as a reference voltage.

9. The driver circuitry as claimed in claim 8, wherein when said semiconductor memory device is about to enter into any one of a sense amplification operation and a re-store operation, said high speed driving device receives one shot pulse signal to turn said switching device ON upon receipt of said one shot pulse signal.

10. The driver circuitry as claimed in claim 1, wherein said high speed driving device receives one shot pulse signal to turn said switching device ON upon receipt of said one shot pulse signal.

11. A memory cell array having:
    a plurality of memory cells;
    a plurality of sense amplifiers;
    a plurality of word lines connected to said memory cells;
    plural sets of first and second digit lines connected to each other through digit line switching devices, and said first digit lines being connected to said memory cells, and said second digit lines being connected to said sense amplifiers;

a control line connected to control terminals of said digit line switching devices;

a driving voltage supply line connected with said sense amplifiers for supplying a driving voltage to said sense amplifiers;

a sense amplifier driving circuit connected between said driving voltage supply line and a power voltage line for supplying a power voltage which is higher than said driving voltage, wherein said sense amplifier driving circuit has a circuit configuration as claimed in claim 1.

12. A semiconductor memory device comprising:

a single power voltage supply line for supplying a power voltage; and a plurality of memory cell arrays connected in parallel to said single power voltage supply line, wherein each of said memory cell arrays comprises a circuit configuration as claimed in claim 11.

* * * * *